United States Patent
Starkovich et al.

(10) Patent No.: US 10,170,338 B2
(45) Date of Patent: Jan. 1, 2019

(54) VERTICAL NANORIBBON ARRAY (VERNA) THERMAL INTERFACE MATERIALS WITH ENHANCED THERMAL TRANSPORT PROPERTIES

(71) Applicant: Northrop Grumman Systems Corporation, Falls Church, VA (US)

(72) Inventors: John A. Starkovich, Redondo Beach, CA (US); Bradley Lyon, Los Angeles, CA (US); Edward M. Silverman, Encino, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/602,383

(22) Filed: May 23, 2017

(65) Prior Publication Data

US 2018/0342405 A1 Nov. 29, 2018

(51) Int. Cl.
*C25B 1/00* (2006.01)
*C01B 32/184* (2017.01)
(Continued)

(52) U.S. Cl.
CPC ............ *H01L 21/4871* (2013.01); *C25B 1/00* (2013.01); *H01L 23/3737* (2013.01);
(Continued)

(58) Field of Classification Search
CPC ................................ C01B 32/194; C25B 1/00
See application file for complete search history.

(56) References Cited

U.S. PATENT DOCUMENTS 8,236,626 B2    8/2012  Dai et al.
2010/0105834 A1* 4/2010  Tour ...................... B82Y 30/00
                                                   525/50
(Continued)

FOREIGN PATENT DOCUMENTS

CN    102774828    11/2012
CN    102757043    7/2014
(Continued)

OTHER PUBLICATIONS

"Electrochemical Unzipping of Multi-walled Carbon Nanotubes for Facile Synthesis of High-Quality Graphene Nanoribbons" by Shinde et al., J. Ann. Chem. Soc. 133, pp. 4168-4171 (2011).*

(Continued)

*Primary Examiner* — Bryan D. Ripa
(74) *Attorney, Agent, or Firm* — Patti & Malvone Law Group, LLC

(57) ABSTRACT

A thermal interface material (TIM) and method for manufacture is disclosed. A vertically aligned carbon nanotube (VACNT) array is formed on a substrate, then individual CNTs are cleaved to form a vertical nanoribbon array (VERNA). An array of aligned, upright, flat, highly-compliant ribbon elements permit a higher packing density, better ribbon-to-ribbon engagement factor, better contact with adjoining surfaces and potentially achievement of theoretical thermal conductance limit (~1 GW/m2K) for such nanostructured polycyclic carbon materials. Methods for forming the VERNA include either or both of electrochemical and gas phase processing steps.

8 Claims, 4 Drawing Sheets

(51) Int. Cl.
*C01B 32/194* (2017.01)
*H01L 21/48* (2006.01)
*H01L 23/00* (2006.01)
*H01L 23/373* (2006.01)

(52) U.S. Cl.
CPC .............. *H01L 24/27* (2013.01); *H01L 24/29* (2013.01); *H01L 2224/2781* (2013.01); *H01L 2224/27831* (2013.01); *H01L 2224/29193* (2013.01); *H01L 2924/20104* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01)

(56) References Cited

U.S. PATENT DOCUMENTS

| | | | | |
|---|---|---|---|---|
| 2013/0175182 | A1* | 7/2013 | Shinde | B82Y 30/00 205/352 |
| 2014/0291819 | A1* | 10/2014 | Barth | H01L 23/53276 257/659 |
| 2014/0371443 | A1* | 12/2014 | Seo | C01B 19/00 536/92 |

FOREIGN PATENT DOCUMENTS

| | | |
|---|---|---|
| CN | 104609396 | 10/2016 |
| WO | 2010022164 | 2/2010 |

OTHER PUBLICATIONS

"Room Temperature Electrochemical Opening of Carbon Nanotubes Followed by HydrogenStorage" by Skowronski et al., Adv. Mater. 15(1), pp. 55-57 (2003).*

"Graphene Nanoribbons Obtained by Electrically Unwrapping Carbon Nanotubes" by Kim et al., ACS Nano 4(3), pp. 1362-1366 (2010).*

Dmitry V. Kosynkin et al "Highly Conductive Graphene Nanoribbons by Longitudinal Splitting of Carbon Nanotubes Using Potassium Vapor", ACS Nano, vol. 5, No. 2; Feb. 22, 2011, pp. 968-974.

Dmitry V. Kosynkin et al "Longitudinal unzipping of carbon nanotubes to form graphene nanoribbons", Nature, MacMillan Journals Ltd, London, vol. 458, Apr. 16, 2009, pp. 872-876.

* cited by examiner

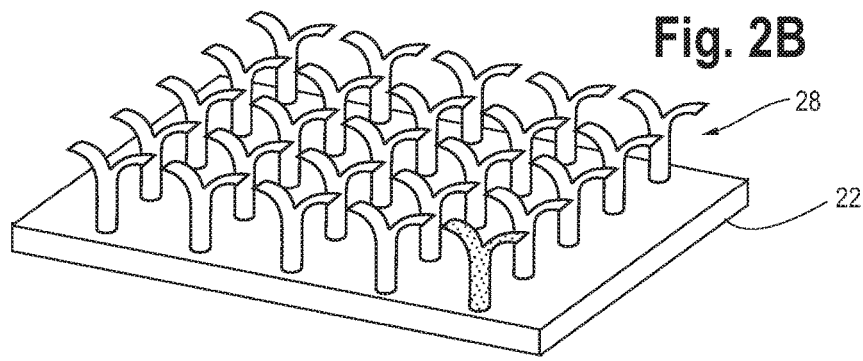
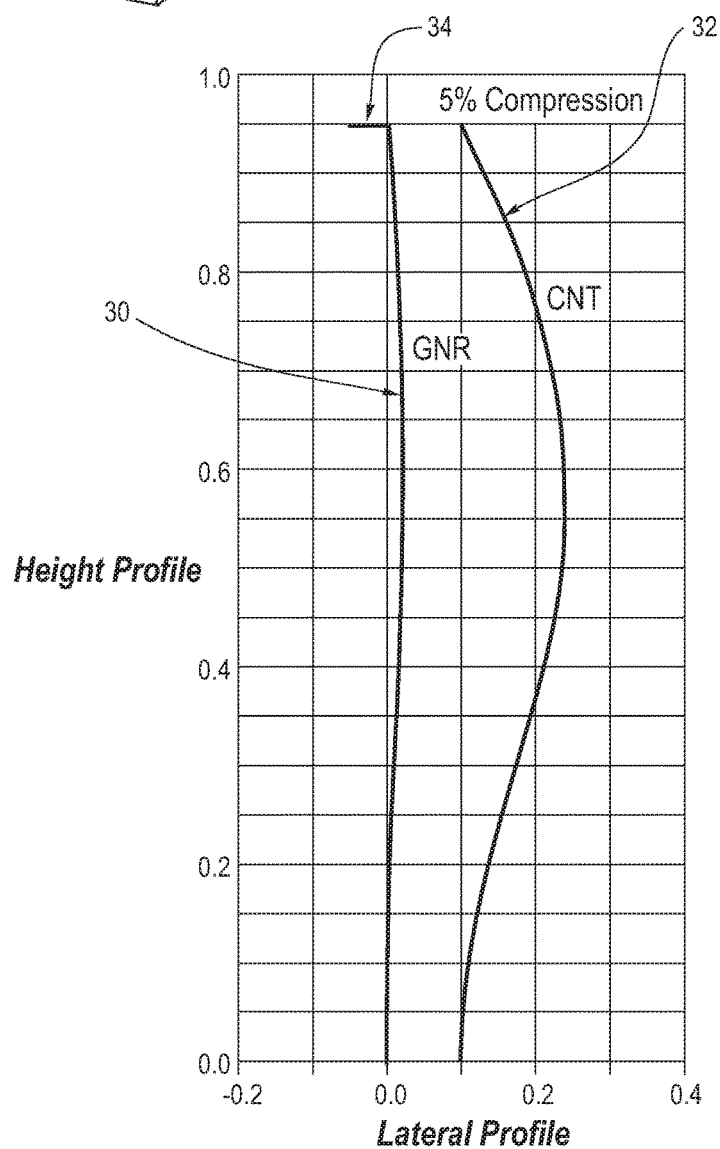

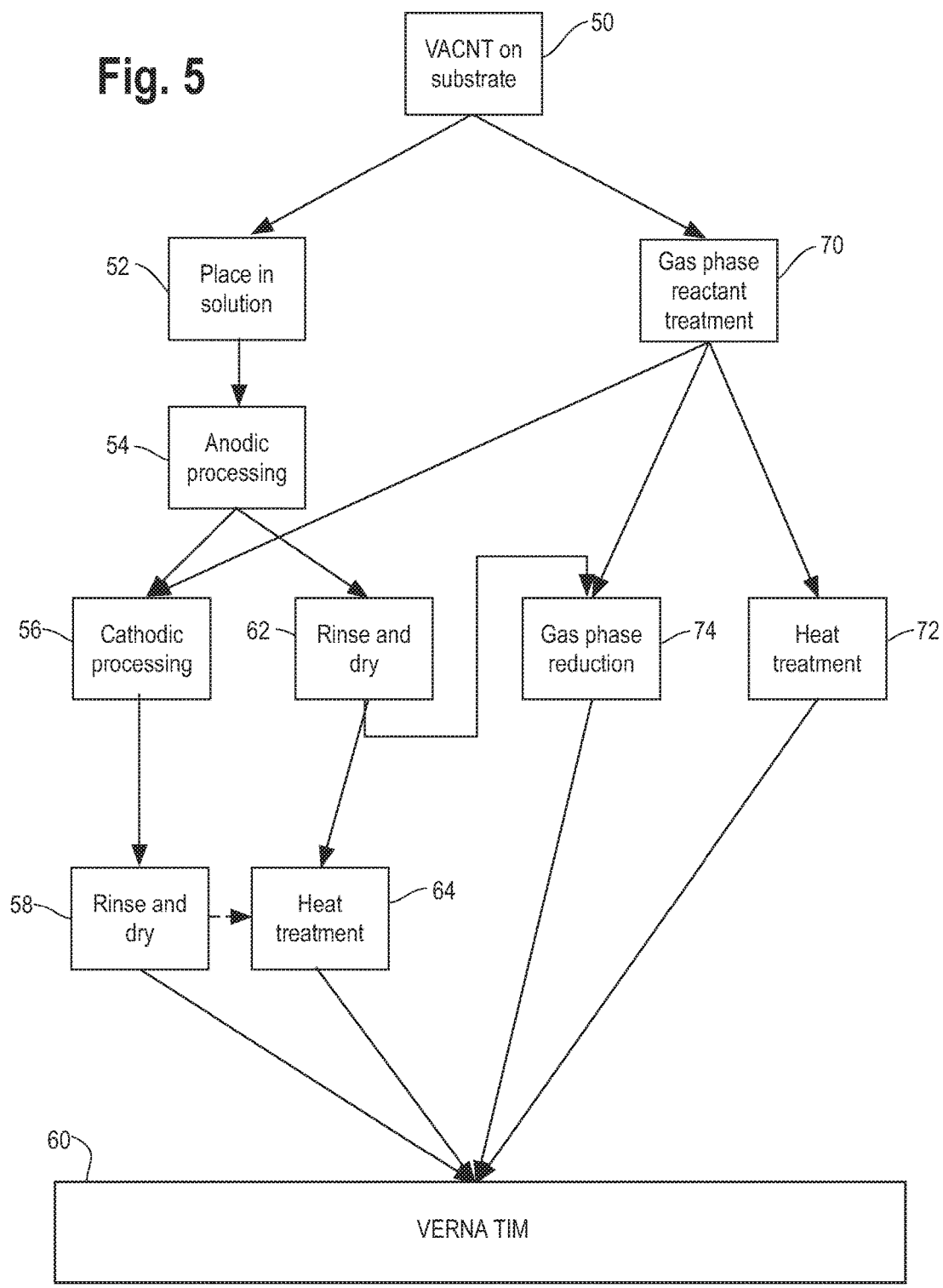

VERTICAL NANORIBBON ARRAY (VERNA) THERMAL INTERFACE MATERIALS WITH ENHANCED THERMAL TRANSPORT PROPERTIES

BACKGROUND

The invention relates generally to thermal interface materials (TIMs) and more specifically to vertically aligned carbon nanotube (VACNT) array based TIMs.

Heat dissipation for high power density devices is a limiting factor impeding development of next generation higher performance electronic devices. FIG. 1 schematically illustrates prior art configuration of a thermal interface material (TIM) as used, for example, in a high power density device 10. One or more chips 20 are mounted on a packaging substrate 12 by means of solder balls 14. One of ordinary skill in the art would understand that there are a variety of methods for attaching chip 20 to packaging substrate 12. A TIM 16 is interposed between heat generating electronic devices such as chip 20 and heat sinks/exchangers 18 to facilitate heat conduction and maintain device 10 within a safe operating temperature range.

Thermal interface materials such as VACNT arrays and metal nanowire (MNW) arrays designed for handling these challenging heat loads are not meeting expectations. Junction temperatures of devices employing current TIMs are consequently expected to rise sharply causing degraded device performance, diminished service life and system reliability issues. Major factors behind the underperforming VACNT and MNW arrays include their limited areal density, transport engagement fraction and the actual contact area available for heat transport. VACNT array areal densities are generally in the 3-10% range with only a fraction (~10-30%) of these within the TIM actually engaged in heat transfer. Even if VACNT arrays can eventually be grown to 2×-3× current areal densities, due to the cylindrically curved shape of a CNT only approximately 1% of their surface is estimated to be active in thermal transfer with the heat extraction surface.

Thus, a need exists for an improved thermal interface material having a higher density that provides greater heat transfer. There is also a need for a TIM having a larger contact area with adjoining surfaces.

SUMMARY

The invention encompasses a vertical nanoribbon array (VERNA) for use as a thermal interface material and a method for making the VERNA. An array of flat, highly-compliant ribbon elements permit a higher packing density, better ribbon-to-ribbon engagement factor, better contact with adjoining surfaces and potentially achievement of theoretical thermal conductance limit (~1 $GW/m^2K$) for such nanostructured polycyclic carbon materials.

In an embodiment, the invention encompasses a method of manufacturing a thermal interface material (TIM) including the steps of growing a vertically aligned carbon nanotube (VACNT) array on a substrate; and processing the VACNT array to create an array of vertically aligned graphene nanoribbons (VERNA).

In a further embodiment, the substrate is an electrically conductive or semiconducting substrate.

In another embodiment, the processing step includes the steps of placing the VACNT array in an electrolyte solution; anodically treating the VACNT to longitudinally cleave each carbon nanotube (CNT) into a graphene oxide nanoribbon (GONR); cathodically polarizing the GONR array to remove oxygen resulting from the step of anodically treating the VACNT; rinsing or exchanging the electrolyte solution with clean water or solvent; and freeze drying or supercritical fluid drying to remove the liquid phase.

In yet another embodiment, the method encompasses a step of treating the VERNA with temperature of approximately 120 to 350 C to remove any remaining oxygen from the VERNA.

In another embodiment, the invention encompasses a method wherein the processing step includes the steps of placing the VACNT array in an electrolyte solution; anodically treating the VACNT to longitudinally cleave each carbon nanotube (CNT) into a graphene oxide nanoribbon (GONR); rinsing or exchanging the electrolyte solution with clean water or solvent; freeze drying or supercritical fluid drying to remove the liquid phase; and treating the array of GONRs with temperature of approximately 120 to 350 C to remove oxygen.

In another embodiment, the invention encompasses a method wherein the processing step includes the steps of placing the VACNT array in an electrolyte solution; anodically treating the VACNT to longitudinally cleave each carbon nanotube (CNT) into a graphene oxide nanoribbon (GONR); rinsing or exchanging the electrolyte solution with clean water or solvent; freeze drying or supercritical fluid drying to remove the liquid phase; and treating the array of GONRs with a gas phase reducing agent.

In any of the above embodiments, the method encompasses a second processing step to longitudinally cleave a portion of each graphene nanoribbon (GNR) to create bifurcated GNRs.

In a further embodiment, the processing step includes the steps of treating the VACNT with gas phase reactant to create an array of graphene oxide nanoribbons (GONRs); and treating the array of GONRs with a gas phase reducing agent to create the VERNA.

In another embodiment, the gas phase reactant is selected from a group including oxygen plasmas, atomic hydrogen and hydrogen plasmas and the gas phase reducing agent is selected from a group including hydrazine vapor, ammonia gas, hydrogen, and gaseous mixtures consisting water vapor, nitrogen and hydrogen.

In a further embodiment, the step of treating the array of GONRs with a gas phase reducing agent is conducted at temperatures of approximately 300 to 600 C.

In any of the above embodiments, the treating steps are conducted under ambient pressure conditions.

In any of the above embodiments, the treating steps are conducted under subambient pressure conditions.

In any of the above embodiments, the treating steps are conducted in pressurized vessels up to 100 bar.

In another embodiment, the processing step includes the steps of treating the VACNT with gas phase reactant to create an array of graphene oxide nanoribbons (GONRs); and treating the array of GONRs with temperature of approximately 120 to 350 C to remove oxygen resulting in a VERNA.

In further embodiments, the invention encompasses a thermal interface material (TIM), formed using any of the above methods.

BRIEF DESCRIPTION OF THE DRAWINGS

Features of example implementations of the invention will become apparent from the description, the claims, and the accompanying drawings in which:

FIGS. 2A and 2B are schematic illustrations of TIMS according to the present invention.

FIG. 3 is graph comparing deformation under compression of graphene nanoribbons (GNRs) and carbon nanotubes (CNTs).

FIG. 5 is a flowchart depicting several methods of producing a TIM according to the present invention.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
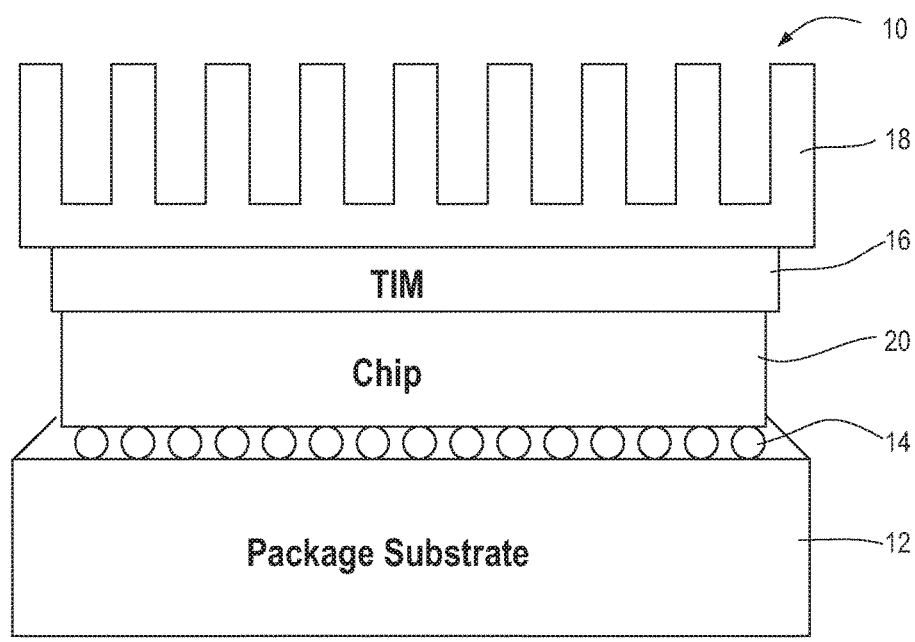
FIG. 1 is schematical illustration of a prior art device incorporating a thermal interface material (TIM).
Figure 2A:
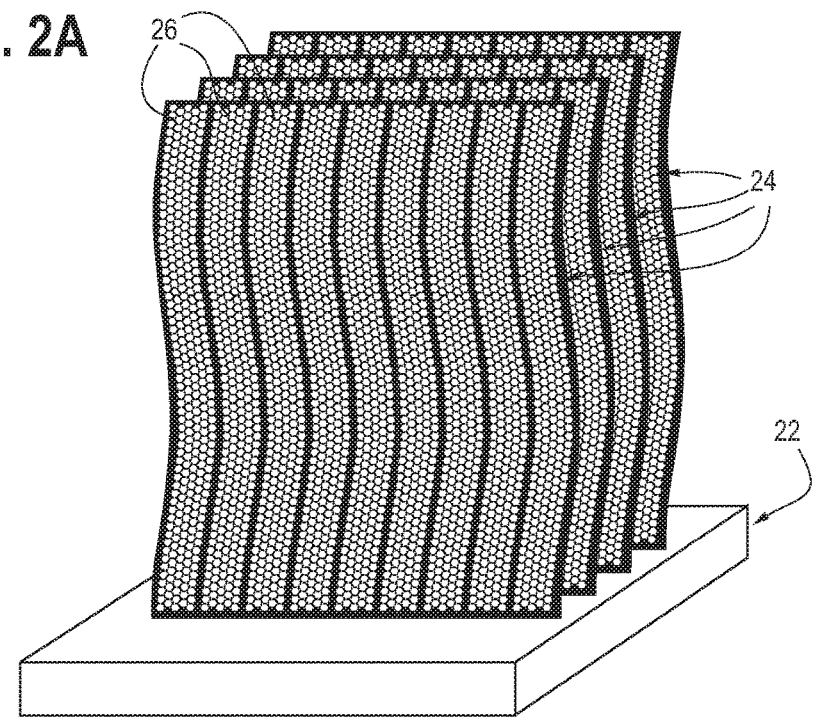

The invention encompasses a thermal interface material (TIM) with increased physical contact area, higher thermal conductivity and reduced interfacial contact resistance. In an embodiment, a vertically aligned carbon nanotube (VACNT) array is processed by "unzipping" or longitudinally cleaving the C—C bonds along one or more sides of each carbon nanotube (CNT) in the array. The process creates an array of aligned flat ribbon-shaped elements that are better suited for heat conduction across interfacial boundaries. In particular, the longitudinal cleaving of the tubular CNT array produces an array of thinner, more compliant and higher conductivity graphene nanoribbons (GNR) 26 as shown in FIG. 2A. This results in a vertically aligned nanoribbon array (VERNA) 24 having significantly improved thermal transport properties. VERNA conductive elements are thin flat nanoribbons 26 of hexagonally sp2-bonded carbon. They are densely packed on a substrate 22. When produced from CNTs they have lateral dimensions ranging from approximately half of the CNT circumference ($\pi D/2$) where D is the diameter (D) of the CNT to its full circumference ($\pi D$) depending on the manner in which the CNTs are unzipped. They have a length dimension similar to the parent CNT. In an embodiment, the CNTs are single walled or multi walled high aspect ratio carbon nanotubes having a diameter of approximately 1-20 nm for single-walled CNTs and 3-100 nm for multi-walled CNTs.

In a further embodiment, the sidewall of each VACNT may be also be doubly cleaved or unzipped to produce a bifurcated type Vertically-Aligned Graphene NanoRibbon Array (VERNA) structure as depicted in FIG. 2B, which shows an array of doubly cleaved CNTs 28 on a substrate 22 similar to that of FIG. 2A.

A comparison of GNRs according to the present invention and CNTs is discussed in connection with FIG. 3, which depicts a graph of each in terms of lateral profile (expressed as a fraction of GNR length) vs. height profile (expressed as a strain or fractional number). As shown in FIG. 3, GNR 30 and CNT 32 are deformed differently under a state of 5% compression. With GNR 30, a portion 34 of the ribbon element collapses or buckles and is folded and strongly bonded by Van der Waals forces to an opposing contact surface. The remainder of GNR 30 remains intact but slightly bowed. CNT 32, due to it's stiffer nature, undergos a larger elastic deformation when compressed. This results in the tip of CNT 32 being moved to a canted angle with the contact surface, thus increasing thermal boundary resistance between a TIM and an adjoining surface.

Figure 4:
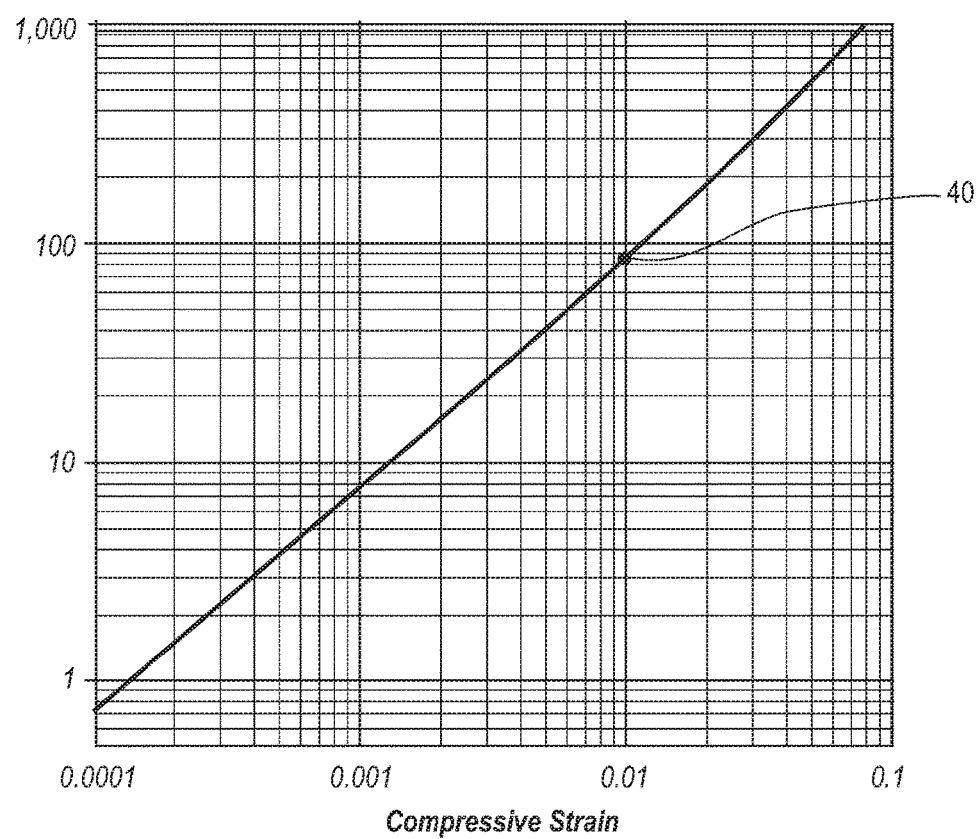
FIG. 4 is graph depicting the heat exchange area comparison between graphene nanoribbons and carbon nanotubes.

For perfectly aligned VACNT array-based systems, heat transport is one-dimensional and heat dissipation will not occur in plane. This is because, given the tubular nature of CNTs, there is very little contact longitudinally between individual CNTs. The advantage in contact area for a GNR over a CNT exchange element depends on the compressive strain and as shown in FIG. 4 can be 1000-fold higher than the tubular CNT element from which the GNR is derived. FIG. 4 shows the relative enhancement in contact area of GNR over CNT as a function of strain. For example, for 0.01 strain (1%), GNR has 85× higher contact area than a similar size CNT as shown, for example, at 40. This larger surface contact area promotes improved phonon transfer/coupling between exchange surfaces and reduces thermal contact resistance between a device surface and a heat exchange surface. In addition, the thermal conductivity of large lateral dimension, defect-free graphene sheets may be approximately 2-3× higher than CNT, enabling array elements with thermal conductivities in 6,000-10,000 W/mK range. The superior thermo-mechanical properties of VERNA make them extremely attractive for high power density device thermal interface applications.

The present invention encompasses forming a VACNT by growing CNTs on an electrically conductive or semiconducting substrate through the use of a catalyst, as would be understood by one of ordinary skill in the art. The VACNT is then processed to cleave the CNTs and form GNRs. The length of time and other processing conditions determine how far the CNT is cleaved longitudinally. In an embodiment, the entire length of the CNT is not cleaved and the bottom portion remains attached to the substrate.

Several methods exist and have been described for longitudinally cleaving or unzipping carbon nanotubes in dilute liquid suspensions as well as in dry, flat, solid films or mats of randomly oriented CNT. Not all of these methods, however, are readily suited for converting VACNT arrays into VERNA with uniform even edges and low or defect-free GNRs. Solution-based chemical methods utilizing, for example, nitric acid, sulfuric acid-potassium permanganate and other oxidizing agents, followed by treatment with a reducing agent such as hydrazine or thermochemically deoxygenated at elevated temperature are prone to produce lower quality GNRs with multiple edge and interior defects.

Methods of accomplishing the present invention will be discussed in connection with FIG. 5. The invention encompasses a method of converting a VACNT arrays into VERNA. In a first step 50 of FIG. 5, a VACNT array is grown on an electrically conductive or semiconducting substrate through the use of a catalyst. An electrochemical method of converting the VACNT into a VERNA is shown on the left branch from step 50, starting with a step 52 of placing the VACNT and substrate in an electrolyte solution consisting of a dissolved salt or dilute acid or base with ionic conductivity as an anode in electrochemical cell. The VACNT is then anodically treated at step 54 to vertically cleave, or unzip, the CNTs, resulting in an array of graphene oxide nanoribbons (GONR). Next, the GONR array is cathodically polarized in step 56 to reduce and remove the oxygen resulting from the anodic treatment. Finally, the VERNA is rinsed or washed with an exchange solvent to remove the salt solution and dried by means of either lyophilization or the use of supercritical fluid processing in step 58 resulting in the VERNA TIM in step 60.

In an alternative embodiment, after anodic processing in step 54, the GONR array may be rinsed and dried in step 62, which is the same as step 58. Then, heat treatment step 64 is used to thermally deoxygenate the GONR array by treating it at an elevated temperature ranging from approximately 120 to 350 C. As shown by the dotted line between steps 58 and 64, the elevated temperature treatment of step 64 may also be used to more fully convert the VERNA of step 58 if desired, to produce a higher quality GNR. No oxidizing or reducing agents are used in this approach.

Use of electrochemical methods to produce VERNA with a highly aligned structure and suitable for use as thermal interface materials requires that electrolyte and wash solutions used during processing must be carefully removed from the converted array by lyophilization (freeze-drying) or supercritical fluid drying techniques to preserve the aligned vertical structure. This is because drying stresses associated with normal evaporative drying methods involving solution-based oxidizing and reducing chemical agents that distort and flatten the VERNA structure and are thus avoided.

On the right side of FIG. 5, an alternative embodiment using gaseous reactants to unzip the VACNT array of step 50 to produce high quality VERNA without the use of special drying procedures is depicted. In this embodiment, a substrate of non-conducting materials such glass, quartz and ceramics may be used as an alternative to the electrically conductive or semiconducting substrates described above. In step 70, the VACNT array on a substrate is treated with a gas phase reactant, for example, oxygen plasmas, atomic hydrogen, hydrogen plasma, or elevated temperature water vapor/steam, to longitudinally cleave/unzip the VACNT array. This avoids destructive drying stresses experienced with liquid based processes. The treated arrays may be subsequently converted into their graphene VERNA form through simple elevated temperature exposure in step 72 as described above with respect to step 58, or treatment with a gaseous reducing agent in step 74. The gas phase reduction treatment of step 74 includes, for example, treating the GONR array with hydrazine vapor, ammonia gas, hydrogen, and gaseous mixtures consisting water vapor, nitrogen and hydrogen at temperatures ranging from 300 to 600 C. The reduction/conversion reactions may be conducted under ambient and subambient pressure conditions as well as in pressurized vessels up to 100 bar. Conversion reaction times involved with these methods range from several minutes to over several hours.

In another embodiment, the electrochemical and gaseous methods can be combined by following rinse and dry step 62 of the electrochemical method with a gas phase reduction step 74.

All of the above described "unzipping" processes cleave sp2 hybridized bonds between carbon atoms. Since a carbon nanotube is under radial stress, once the unzipping process begins, typically at a defect site, a chain reaction occurs that ultimately results in a graphene nanoribbon. The unzipping process opens the valance state of the carbon atoms and adds oxygen, resulting in oxygenated species on the edges of the ribbon. However, most of this oxygen is of a carboxylate form, which is easily removed by heating the ribbon to temps well below those at which carbon will oxidize. Parameters of the unzipping process are chosen so that the process is controlled to result in smooth, even edges. These parameters include length of time, which could vary from a few minutes to several hours and is impacted by the concentration of reagents, electrical potential and current limits.

Depending on the presence of defects in the original VACNT, the bifurcated GNRs of FIG. 2B may be created from a single process as described above, or may require a second step of electrochemical processing.

If used and unless otherwise stated, the terms "upper," "lower," "front," "back," "over," "under," and similar such terms are not to be construed as limiting the invention to a particular orientation. Instead, these terms are used only on a relative basis.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A method of manufacturing a thermal interface material (TIM), comprising the steps of:
   growing a vertically aligned carbon nanotube (VACNT) array on a substrate;
   placing the VACNT array in an electrolyte solution;
   anodically treating the VACNT to longitudinally cleave the carbon nanotubes (CNTs) into vertical graphene oxide nanoribbons (GONRs); and
   processing the GONRs to remove oxygen and create an array of vertically aligned graphene nanoribbons (VERNA).

2. The method of claim 1, wherein the substrate is an electrically conductive or semiconducting substrate.

3. The method of claim 2, wherein the processing step further comprises the steps of:
   cathodically polarizing the GONR array to remove oxygen resulting from the step of anodically treating the VACNT;
   rinsing or exchanging the electrolyte solution with clean water or solvent; and
   freeze drying or supercritical fluid drying to remove the liquid phase.

4. The method of claim 3, further comprising a step of treating the VERNA with temperature of approximately 120 to 350 C to remove any remaining oxygen from the VERNA.

5. The method of claim 2, wherein the processing step further comprises the steps of:
   rinsing or exchanging the electrolyte solution with clean water or solvent;
   freeze drying or supercritical fluid drying to remove the liquid phase; and
   treating the array of GONRs with temperature of approximately 120 to 350 C to remove oxygen.

6. The method of claim 2, wherein the processing step further comprises the steps of:
   rinsing or exchanging the electrolyte solution with clean water or solvent;
   freeze drying or supercritical fluid drying to remove the liquid phase; and
   treating the array of GONRs with a gas phase reducing agent to create the VERNA.

7. The method of claim 1, further comprising a second processing step to longitudinally cleave a portion of each graphene nanoribbon (GNR) to create bifurcated GNRs.

8. A method of manufacturing a thermal interface material (TIM), comprising the steps of:
   growing a vertically aligned carbon nanotube (VACNT) array on a substrate;
   processing the VACNT array to create an array of vertically aligned graphene nanoribbons (VERNA); and
   processing the VERNA to longitudinally cleave a portion of each graphene nanoribbon (GNR) to create bifurcated GNRs.

\* \* \* \* \*